United States Patent [19]
Thornburg et al.

[11] 3,956,042
[45] May 11, 1976

[54] SELECTIVE ETCHANTS FOR THIN FILM DEVICES

[75] Inventors: David D. Thornburg, Los Altos; Richard I. Johnson, Menlo Park, both of Calif.

[73] Assignee: Xerox Corporation, Stamford, Conn.

[22] Filed: Nov. 7, 1974

[21] Appl. No.: 521,591

[52] U.S. Cl. .................... 156/3; 156/7; 156/11; 156/17; 156/18; 357/2
[51] Int. Cl.² .................................. H01L 21/12
[58] Field of Search ........... 252/79.2; 156/17, 18, 156/3, 11; 106/47; 357/2; 29/578

[56] References Cited
UNITED STATES PATENTS

| | | | |
|---|---|---|---|
| 2,834,659 | 5/1958 | Mathre et al. | 252/79.2 |
| 3,271,591 | 9/1966 | Ovshinsky | 357/2 |
| 3,469,154 | 9/1969 | Scholer | 357/2 |
| 3,675,090 | 7/1972 | Neale | 357/2 |
| 3,775,200 | 11/1973 | de Nobel et al. | 156/17 |
| 3,801,878 | 4/1974 | Merrin | 357/2 |
| 3,816,197 | 6/1974 | Neale | 156/11 |
| 3,872,492 | 3/1975 | Robbins | 357/2 |
| 3,876,985 | 4/1975 | Fritsche et al. | 357/2 |
| 3,878,008 | 4/1975 | Gleason | 156/11 |
| 3,906,537 | 9/1975 | Thornburg et al. | 357/2 |

OTHER PUBLICATIONS
"Selective Etching of Gallium Arsenide Crystals in $H_2SO_4$—$H_2O_2$—$H_2O$ System", S. Iida and K. Ito, *Journal of Electrical Society*, Vol. 118–No. 5 (1971), p. 768.

Primary Examiner—William A. Powell
Assistant Examiner—Jerome W. Massie
Attorney, Agent, or Firm—John E. Beck; Terry J. Anderson; Leonard Zalman

[57] ABSTRACT

A method of making thin film devices with selective etchants. Specifically, a fabrication process in accordance with the invention provides for the manufacture of amorphous chalcogenide sandwich structures. Such structures consist of a glass substrate, a chromium or aluminum electrode on the substrate bounding one side of the chalcogenide layer, and a second electrode of aluminum bounding the other side of the chalcogenide layer. First, the aluminum electrode is etched without affecting the other layers. Secondly, the chalcogenide layer is etched with a solution which attacks only the chalcogenide material and neither the overlying aluminum nor the underlying chromium or aluminum electrode. This two-step process is particularly suitable for fabricating current controlled negative differential resistance devices which requires the precise registration of one of the electrodes with the boundary of the chalcogenide such that a coextensive boundary is achieved.

1 Claim, 8 Drawing Figures

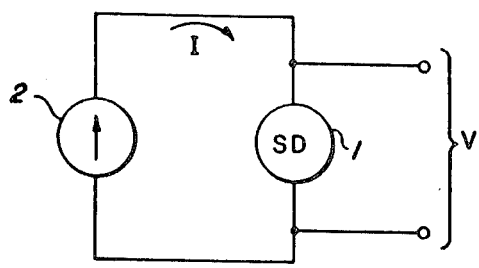
FIG. 1
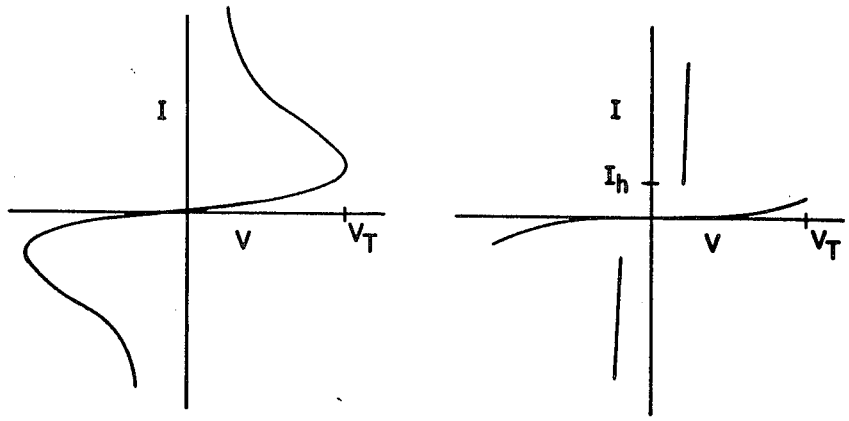
CURRENT CONTROLLED
NEGATIVE DIFFERENTIAL
RESISTANCE
FIG. 2a
THRESHOLD
SWITCHING
FIG. 2b
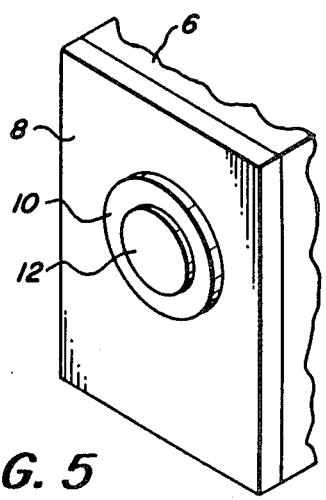
FIG. 5

SELECTIVE ETCHANTS FOR THIN FILM DEVICES

BACKGROUND OF THE INVENTION

This invention relates in general to thin-film solid state devices and more particularly to a method for making thin-film devices comprising semiconductive glass compositions.

Recently, semiconducting devices have been developed which are made from solid substances that are glassy rather than crystalline which nevertheless may be employed to control the flow of electric current. An important example of such a device is the Ovonic switch developed by Stanford R. Ovshinsky. His switch is a threshold device comprising a two-terminal component which may have two states in an electrical circuit, namely, an almost non-conducting state and a conducting state. The device is usually in the nearly non-conducting state, i.e., off; but when the voltage across the device reaches a certain threshold value, it goes to the conducting state, i.e., switches on. On the removal of the applied voltage, the off state is immediately restored.

Among the many types of non-crystalline materials which are being investigated for such devices are amorphous oxides (including oxides of the vanadium, tungsten, phosphorous, germanium and silicon) and chalcogenide glasses, which may be regarded as inorganic polymers. The term chalcogenic is applied to any of the elements in Group VIa of the periodic table: oxygen, sulphur, selenium, and tellurium. The chalcogenide glasses include binary systems (for example, germanium-tellurium), ternary systems (various three-component mixtures of germanium, arsenic, tellurium, silicon, selenium zinc, and cadmium) and quarternary systems composed of the same elements.

Semiconducting glasses of specific compositions have been shown by Shanefield in U.S. Pat. No. 3,448,425 to exhibit current controlled negative differential resistance (CNDR), rather than threshold switching (TS). Shanefield found that a semiconductive glass composition of the ternary group arsenic-tellurium-sellenium may have a voltage-current characteristic initially exhibiting relatively high resistance. As the applied voltage is increased, a form of "breakover" occurs in which the voltage-current characteristic exhibits negative incremental resistance. If after breakover has occurred and the applied voltage is maintained at a predetermined sustaining value, the glass exhibits relatively low electrical resistance. The glass is stable only in its high resistance state, and reverts to this state when the applied voltage is removed. These devices thus have a region of negative differential resistance which is suitable for the construction of practical oscillators, amplifiers and other devices employing negative resistance effects.

Fabrication of these thin-film devices has proven to be a delicate task, particularly in providing the critical registration requirements for a CNDR device. A fabrication process is taught herein which assures a high yield of such devices with improved reliability.

It is yet another object of the invention to fabricate thin-film devices at lower production costs.

Other objects of the invention will be evident from the description hereinafter presented.

SUMMARY OF THE INVENTION

The invention provides for a method of making amorphous semiconducting thin-film devices. Through the use of selective etchants in accordance with the invention, various geometries of such devices may be easily formed, which geometries thereby determine the particular operating characteristics for a given device. For example, either current controlled negative differential resistance or threshold switching behavior can be observed for a given chalcogenide glass, depending upon the configuration of the device which embodies it. These devices are comprised of the semiconductive glass in contact with at least two spaced electrodes.

If the glass is coextensive with the boundary defined by the contact loci between the glass and the electrodes, the current controlled negative differential resistance behavior will be exhibited. However, if the glass extends beyond the contact surface established with one of the electrodes, threshold switching may be attained. By modifying the geometry of such an amorphous semiconductor having a given chemical composition, one may choose the mode of operation intended for the device.

A fabrication process is provided for the formation of these thin-film structures. Such structures consist of a glass substrate, a chromium or aluminum electrode on the substrate bounding one side of the chalcogenide layer, and a second electrode of aluminum bounding the other side of the chalcogenide layer. First, the aluminum electrode is etched without affecting the other layers. Secondly, the chalcogenide layer is etched with a solution which attacks only the chalcogenide material and neither the overlying aluminum nor the underlying chromium or aluminum electrode. This process is particularly suitable for fabricating current controlled negative differential resistance devices which requires the precise registration of one of the electrodes with the boundary of the chalcogenide such that a coextensive boundary is achieved. Furthermore, this approach permits one-step mask processing.

These and other features which are considered to be characteristic to this invention are set with particularly in the appended claims. The invention itself, as well as additional objects and advantages thereof, will best be understood from the following description when considered in conjunction with the accompanying drawings.

BRIEF DESCRIPTION OF THE DRAWINGS

FIG. 1 is a schematic circuit for biasing a device of the present invention;

FIG. 2a is a graphical representation of current controlled negative differential resistance behavior exhibited by an amorphous semiconductor device;

FIG. 2b is a graphical representation of threshold switching behavior exhibited by an amorphous semiconductor device;

FIG. 5 is a schematic isometric view of a thin-film semiconductor device.

DESCRIPTION OF THE PREFERRED EMBODIMENT

In FIG. 1 is shown a schematic circuit for biasing a two-terminal semiconductor device 1. The semiconductor device 1 is biased by a variable current source 2. The voltage V across the device 1 will vary with the current I depending upon the geometry as well as the chemical composition of the device 1.

If the device 1 exhibits negative resistance effects, the V-I characteristic would be that shown in FIG. 2a. For a current controlled negative differential resistance (CNDR) behavior, it is seen that all regions of the V-I curve are accessible. For positive currents, these regions are of three types: a generally high resistance region from the origin to the turnover voltage, $V_T$; a region of negative differential resistance; and a region of low resistance. This curve is typically symmetric upon a reversal of the applied current.

If the device 1 exhibits threshold switching (TS) behavior, its V-I characteristic would be that shown in FIG. 2b. For TS all regions of the V-I curve are not accessible. In fact, the V-I characteristic of the device 1 is comprised of regions of two types: a generally high resistance region from the origin to $V_T$ and then an abrupt transition to a low resistance branch of the curve which is not sustained below the current value $I_h$. This curve is also symmetric upon the reversal of the applied current.

Figure 3A:
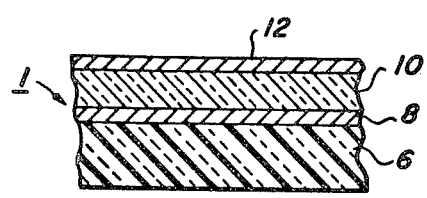
FIG. 3 is a cross-sectional view of a semiconductor device having certain geometries which exhibit current controlled negative differential resistance behavior.

One device configuration which yields CNDR behavior is shown in two stages of fabrication in schematic cross section in FIG. 3a and b. In FIG. 3a the device 1 is comprised of various layers deposited upon a substrate 6 which may be a dielectric or conductive material. For example, the substrate 6 may be made of a smooth sheet of glass or metal. If the substrate 6 is not capable of carrying an electric current, a thin film 8 of conductive material is to be deposited on the surface of the substrate 6. The film 8 may consist of a thin (<1 $\mu$m) layer of chromium or aluminum, for example. Next, a layer 10 of semiconducting material is deposited on the conductive film 8.

The semiconducting material may consist of, but is not restricted to, the class of amorphous materials known as chalcogenide glasses. Some examples of these, which have been used in the devices described within this preferred embodiment, are alloys consisting of, by atomic fraction, 40% arsenic, 60% tellurium; 40% arsenic, 40% selenium, 20% tellurium; 40% arsenic, 20% selenium, 40% tellurium; 48% tellurium, 30% arsenic, 12% silicon, 10% germanium; and numerous other alloys which would be chosen for their electrical properties and resistance to crystallization. The semiconductor layer 10 may be of any reasonable thickness and in this preferred embodiment would be on the order of 1 $\mu$m. On the exposed surface of the layer 10 is deposited an additional conductive film 12. A suitable material for the film 12 would be an aluminum layer 0.5 $\mu$m thick. The conductive films 12 and 8 would serve as the electrode media for the device 1.

The particular geometry desired is formed through the use of selective etchants. First, the aluminum film 12 is etched to the desired dimension without damaging the underlying chalcogenide. This is done by applying photoresist on the aluminum film 12 and, assuming a positive photoresist such as Shipleys AZ 1350, exposing a mask of the desired pattern. The pattern is then developed in any commercially available photoresist developer in order to remove the photoresist from areas exposed to light. Photoresist thereby remains on the film areas corresponding to the mask pattern. As acidic aluminum etchant in accordance with the invention is then applied to the surface of the film 12 whereby the portion unprotected by the photoresist is removed.

The preferred aluminum etchant is composed of 99 parts (by volume) of concentrated phosphoric acid ($H_3PO_4$) and 1 part of hydrogen peroxide ($H_2O_2$ — 30%). These two chemicals can be mixed easily at room temperature and used immediately. This etch is normally used at 50°C and we obtain etch rates of about 2000 A per minute at this temperature.

The advantages of this etchant over commercial ones is that it is selective to the degree required to dimension the film 12 without damaging the underlying chalcogenide and without attacking the photoresist. This etchant, furthermore, has high resolution because of low bubble formation, and minimal undercutting. It is relatively fast and yet it can be used at moderate temperatures such as 50°C which will not damage the chalcogenide layer 10. The etchant also has long life, is inexpensive and simple to prepare, and can be easily rinsed away in water.

If a CNDR geometry is desired, then the photoresist is allowed to remain on the film 12 and a second etchant is applied to the surfaces of the film 12 and the exposed portion of the layer 10. This second etchant is composed such that when applied attacks only the chalogenide material and not the overlying aluminum electrode formed nor the underlying chromium or aluminum film 8. This etchant must also be inert with respect to the photoresist. The result is that the chalcogenide layer 10 is formed coextensive with the dimensions of the etched film 12, which constitutes one of the electrodes. Thereby, a one-mask process is provided for forming CNDR devices.

This second etchant is preferably composed (by volume) of 25 parts water ($H_2O$) plus 35 parts concentrated sulfuric acid ($H_2SO_4$) plus 10 parts of hydrogen peroxide solution ($H_2O_2$ — 30%). These constituents can be mixed in the order given above at room temperature. This etchant is to be normally used at 25°C and at this temperature etch rates of about 20,000 A per minute are obtained. This rate is somewhat dependent upon the concentration of Se or Te in the layer 10.

The advantages of this etchant over commercial ones is that it has been found to be effective with $As_2(Se—Te)_3$ glass and also with Ovshinsky's $Te_{48}As_{30}Si_{12}Ge_{10}$ glass, with little attack to either aluminum or chromium or the photoresist. It has long life, it is inexpensive and yet easily prepared. It can be used at room temperature and still maintain a very high etch rate with minimal undercutting. It has excellent resolution and produces virtually no bubbles during the etch. It is easily rinsed off in water.

Figure 3B:
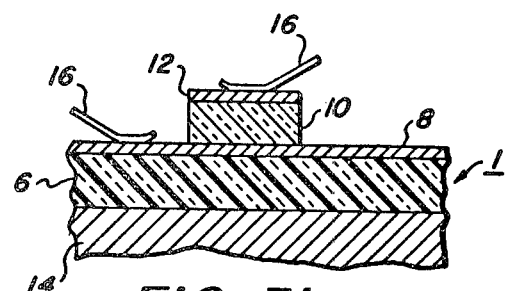

FIG. 3b shows a CNDR device 1 which results from modifying the conducting film 12 to define a conductive pad of some defined geometry, e.g. a square or circle, by this one-mask process. The semiconductor layer 10 is etched to have the same domain and geometry as the conductive film 12. Specifically, the second etching process is accomplished by the use of a selective chemical etch, using the conductive pad as a mask. The substrate 6 may then be bonded to a fixture 14 with an adhesive, usually chosen for good thermal transport properties. Conductive wires 16 are bonded to the conductive films 8 and 12 to effectively use such films as electrodes.

Figure 4A:
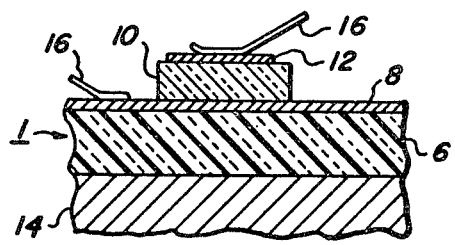
FIG. 4 is a cross-sectional view of certain geometries of a semiconductor device which exhibits threshold switching behavior.

A method for fabricating the device which displays threshold switching effects is to fabricate the device shown in FIG. 3a of the same or different chemical composition and define a geometry different from that shown in FIG. 3b. A device 1 which would exhibit TS behavior would be that shown in FIG. 4a. To form the TS geometry, the same first step in the case of forming the CNDR geometry is used to define the dimension of the film 12. After this step of etching the aluminum film 12, however, it will be necessary to strip the photoresist remaining on the film 12 with acetone and remask the structure such that a new pattern of photoresist covers the layer 10 defining an outer boundary for the layer 10 which extends beyond the boundary of the film 12. The second etchant would then be applied to so form the layer 10 relation to the film 12. The substrate 6 is then bonded to the fixture 14 and the conductive wires 16 are bonded respectively to the conductive films 8 and 12. Merely the difference in device geometry will result in an amorphous semiconducting device which displays threshold switching behavior, rather than negative resistance effects.

As well as these embodiments, the etchants taught herein can be used in conjunction with aluminum, chromium and the chalcogenide glasses in many structural variations.

Figure 4B:
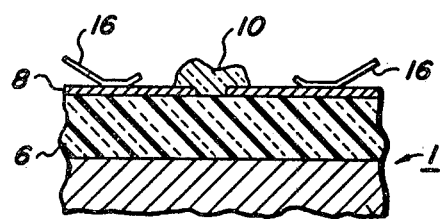

As shown in FIG. 4b, a coplanar geometry may be defined which produces threshold switching behavior. This geometry incorporates only one conductive film 8 which contains a gap which electrically isolates one side of the film from the other. The gap is produced photolithographically to insure that the gap is small (approximately 5 $\mu$m). The semiconductor layer 10 is then deposited so as to fill the gap and extend beyond the boundaries defined by the gap. The semiconductor layer 10 is etched from regions exterior to the gap so as to allow electrical contact to be made between the layer 10 and the film 8. The gap may be of uniform width or curved as desired.

CNDR behavior is enhanced for geometries with no semiconductor material extent beyond the boundaries defined by its respective electrodes, while TS behavior is enhanced for geometries with semiconductor material extending greater than a certain discernible extent beyond the boundary defined by the contact surface between one of the electrodes and the material itself. Numerous other geometries than shown in this preferred embodiment may be configured to produce CNDR or TS effects. The critical parameter, then, is the use of geometries to produce the desired effect even though the chemical composition of the devices with differing geometries may be identical. This finding directly controverts the commonly accepted belief that the chemical mechanisms which lead to TS behavior are radically different than those which lead to CNDR effects.

The transition and device behavior by virtue of a mere change in geometry may be explained yet within the framework of a single mechanism for both effects. Devices were fabricated on several 25 × 25mm$^2$ Corning 0211 glass substrates 6 (0.018 cm thick) by successive vapor deposition of thin films 8, 10 and 12, respectively of Cr(0.25 $\mu$m), amorphous (a-)As$_2$SeTe$_2$ (1.21 $\mu$m), and Al(0.5 $\mu$m). The metal films 8 and 12 were deposited in a conventional high vacuum system at 10$^{-7}$ Torr. Subsequent to the growth of the films, all substrates 6 were subjected to the photolithographic and chemical etching procedures disclosed herein to define arrays of circular devices. These devices consisted of circular aluminum electrodes 12 of radius $r$ centered over chalcogenide discs 10 of radius $R > r$. The Cr film 8 served as the common electrode for all devices in the array and was not etched. A schematic view of a completed device as described is shown in FIG. 5. For all devices, $r = 1.9 \times 10^{-2}$cm. These devices constituted an array A composed of a plurality of devices having geometries similar to that shown in FIG. 4a.

An array B of these devices was fabricated from the array A by the additional step of using the aluminum circular film 12 as a mask for etching the chalcogenide layer 10 such that $r = R$ for all the devices in this latter array B. Completed device arrays were scribed into 0.1 inch squares and mounted on TO-101 header fixtures 14 with a thermally conductive epoxy. Al wires were ultrasonically bonded to the header leads and the individual devices. All measurements were made at 24°C.

The array B devices ($r = R$) showed stable CNDR behavior with turnover occurring at ~24 V and ~1 mA. As the bias was increased into the negative resistance region, hysteresis of the V-I trace was evident. Increasing the device current to 7 mA resulted in no significant changes in the V-I characteristic, although such high currents result in enhanced crystallization kinetics and hence early failure of the device.

The properties of the array A devices were initially quite similar to those of array B devices in that a region of CNDR was initially observed upon increasing the bias. Once into the negative resistance regime, however, the V-I characteristic spontaneously changed from CNDR to TS behavior. An attempt was made to correlate the current at which this transition takes place with the extent of chalcogenide overlap in relation to the Al film 12; however, the data showed much scatter and no clear dependence on the ratio R/r. Transition currents typically ranged from 1 to 5 mA. With respect to each of the arrays, V$_T$ was identical, independent of which effect was observed.

The difference in V-I characteristics between the two arrays may be explained in terms of heating characteristics. One dimensional heat flow and CNDR behavior may be favored for the array B devices by virtue of the fact that the geometry of such devices places all the chalcogenide glass within a uniform electric field (all the chalcogenide glass is within the boundaries defined by the outer periphery of the respective conductive films 8 and 12). One characteristic of systems displaying CNDR is the possibility of current filamentation. This phenomenon results when a device is biased into the CNDR regime and one region of the semiconducting layer may carry an increased current density over that carried in neighboring areas. This increase in current density will result in a reduction in device voltage, and hence reduce current density in other areas of the device. At steady-state, most of the device current is being carried by a small high-current density filament, which need not be structurally different from the surrounding material. Filament formation need not take place if the boundary conditions of the system do not favor it, as is the case with array B devices.

Filament formation, however, may occur in array A devices, exhibiting TS behavior, since radial as well as axial heat flow can occur in the chalcogenide glass layer. Furthermore, large fringing fields will be present at the point at which the chalcogenide material crosses under the Al electrode 12. Such high field points could readily serve as nucleation sites for a current filament. It has been shown by A. C. Warren, Journal of Non-Crystalline Solids, 4, and others subsequently that models which lead to current filamention also lead to TS behavior. $<\dot{g}>$, the average rate of production of Gibbs free energy per unit volume of the chalcogenide glass, may be calculated for the case of filamentry and non-filamentry conduction, respectively. It has been found that a geometry chosen, such as that shown in FIG. 4, which favors filament formation produces a lower Gibbs free energy where $V > V_T$, since the resulting filamentation would sharply increase entropy production. The difference between $<\dot{g}>$ for filamentry and non-filamentry conduction may be the driving force for the transition from CNDR to TS behavior.

Obviously, many different geometries and process techniques other than those taught herein are possible in the light of this teaching. It is therefore to be understood that, in the scope of the appended claims, the invention may be practiced other than as specifically described.

What is claimed is:

1. A method of masking a non-rectifying solid state device having a desired voltage-current characteristic comprising:

providing a thin-film structure comprised of a body of a chalcogenide glass which is bounded on a first side by a first electrode and on a second side opposed to said first side by a second electrode, forming a first pattern of a protective photoresist over a portion of said first electrode, applying a first etchant to the unprotected portion of said first electrode, said first etchant selectively etching through the unprotected portion of said first electrode without etching any portion of said body of chalcogenide glass to provide said first electrode with a desired surface geometry, removing said first pattern of protective photoresist, forming a second pattern of protective photoresist over said first electrode of said desired surface geometry and over a portion of said first side of said body of chalcogenide glass adjacent said first electrode of said desired surface geometry, and applying a second etchant to the unprotected portion of said first side of said body of chalcogenide glass, said second etchant selectively etching through said body of chalcogenide glass without etching any portion of said second electrode, whereby the outer boundary of said etched body of chalcogenide glass extends beyond said desired surface geometry of said first electrode.

* * * * *